(12) United States Patent
Denis et al.

(10) Patent No.: US 11,168,188 B1
(45) Date of Patent: Nov. 9, 2021

(54) PROCESS FOR FABRICATING ONE OR MORE ULTRA-LARGE AREA NANOSCALE POLYMER FILMS

(71) Applicant: United States of America as represented by the Administrator of NASA, Washington, DC (US)

(72) Inventors: Kevin L. Denis, Crofton, MD (US); Edward J. Wollack, Clarksville, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 60 days.

(21) Appl. No.: 16/352,948

(22) Filed: Mar. 14, 2019

(51) Int. Cl.
| | |
|---|---|
| H01L 21/68 | (2006.01) |
| C08J 5/18 | (2006.01) |
| C08L 45/00 | (2006.01) |
| H01L 21/683 | (2006.01) |
| H01L 21/02 | (2006.01) |

(52) U.S. Cl.
CPC ............. *C08J 5/18* (2013.01); *C08L 45/00* (2013.01); *H01L 21/02282* (2013.01); *H01L 21/02318* (2013.01); *H01L 21/6836* (2013.01); *C08J 2345/00* (2013.01); *H01L 2221/68386* (2013.01)

(58) Field of Classification Search
CPC ............ C23C 16/4405; C23C 16/4412; C23C 16/402; C23C 16/50; C23C 16/52
See application file for complete search history.

(56) References Cited

U.S. PATENT DOCUMENTS

2018/0016471 A1* 1/2018 Kamochi ............ B32B 38/0012

OTHER PUBLICATIONS

Wollack, E.J., Denis, K.L., Barlis, A., Chang, M.-P., Kutyrev, A.S., Miller, K.H., Nagler, P C., "Far Infrared Properties of Cyclic Olefin Copolymer" Optics Letters (2019).

* cited by examiner

*Primary Examiner* — Tony Tran
(74) *Attorney, Agent, or Firm* — Christopher O. Edwards; Bryan A. Geurts; Helen M. Galus

(57) ABSTRACT

The process to fabricate a polymer film includes baking a cyclic olefin copolymer (COC) and a silicon wafer at a predefined temperature. The process also includes attaching a plastic tape frame to the silicon wafer and submerging the COC and the plastic tape frame within water allowing one or more ultra-thin sheets of COC film to be peeled off.

6 Claims, 2 Drawing Sheets

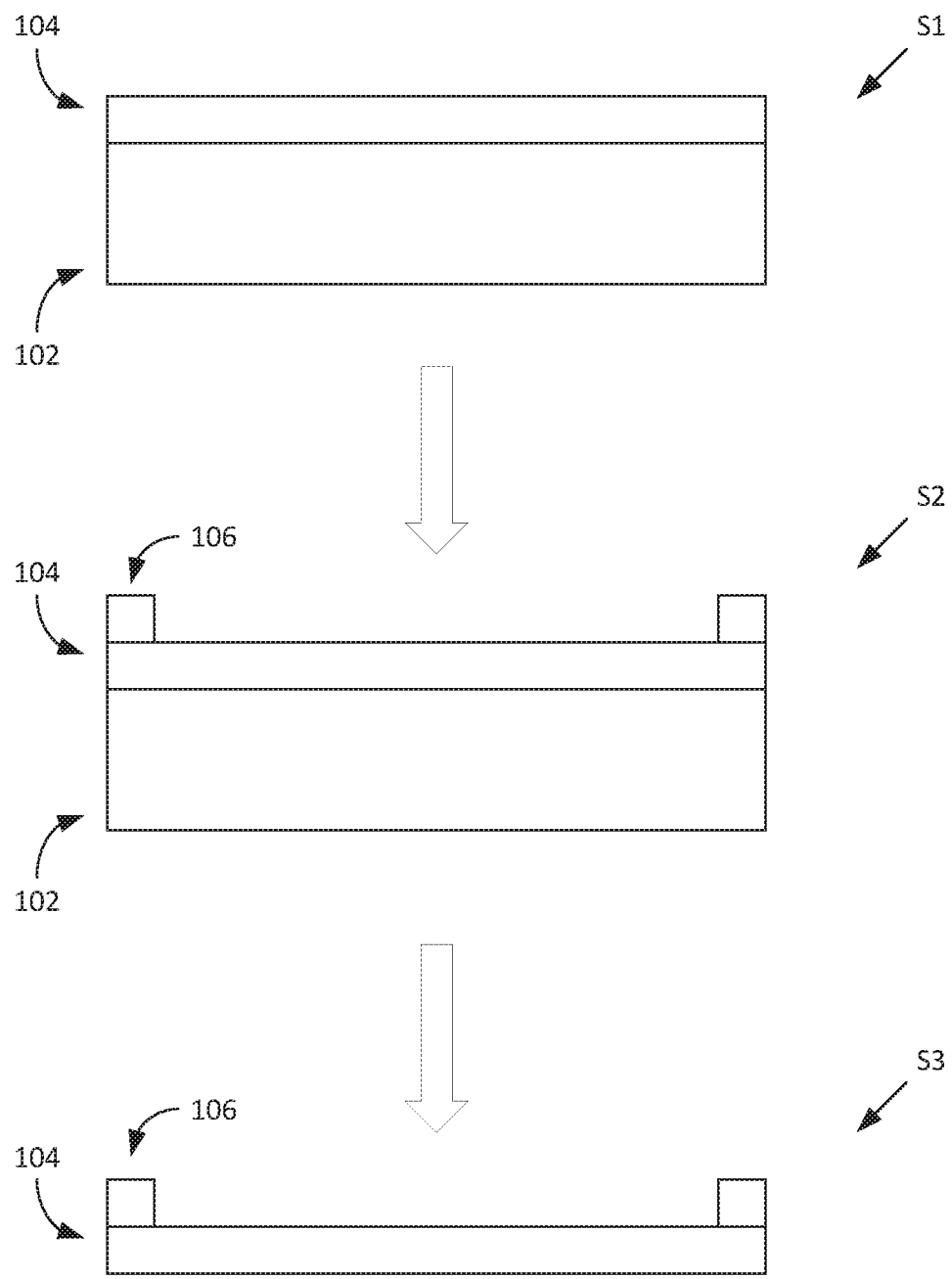

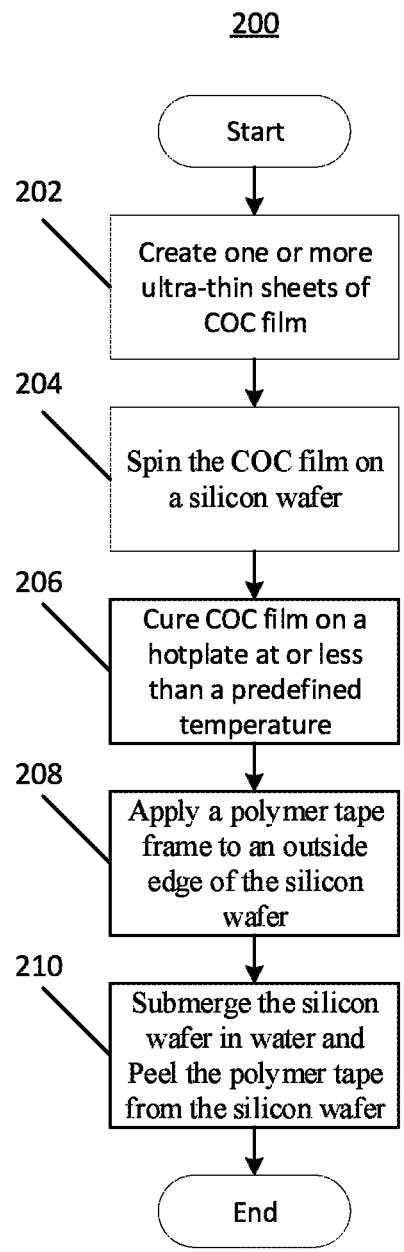

PROCESS FOR FABRICATING ONE OR MORE ULTRA-LARGE AREA NANOSCALE POLYMER FILMS

STATEMENT OF FEDERAL RIGHTS

The invention described herein was made by employees of the United States Government and may be manufactured and used by or for the Government for Government purposes without the payment of any royalties thereon or therefore.

FIELD

Some embodiments generally pertain to a process for manufacturing a polymer film.

BACKGROUND

Optical applications require windows with a large clear aperture area for a number of applications. For example, windows may be required to provide out of band spectral rejection. In another example, windows may be required for the protection of instrument optics from dust and contamination. The approach described to realized thin membranes may also be used protect substrate surfaces encountered in micro-fabrication processing.

To obtain the highest optical transmission efficiency, these windows are required to be thin as possible for reduced absorption. An absence of absorption bands across the waveband of interest in the material is beneficial; especially in infrared (IR) applications. This also has implications for the material's microwave properties by reducing the contributions from the wings of IR lines to the dielectric loss tangent (i.e., the ratio of the conduction to displacement current). As a result, thin films can potentially used as a waveguide media. For x-ray applications, the incorporation of an opaque conductive layer is used to reject incident optical radiation. Additionally, very large clear aperture area windows are required for next generation optical instruments. These considerations motivate the detailed material selection and fabrication processes used in the implementation of the innovation.

Current technologies require mechanical support structures, which to reduce optical throughput and are fabricated by complicated lithographic processes.

Thus, an alternative fabrication process that enables submicron thickness films with very large diameters up to 10 cm and larger at very low cost may be beneficial.

SUMMARY

Certain embodiments of the present invention may provide solutions to the problems and needs in the art that have not yet been fully identified, appreciated, or solved by current fabrication processes.

In one embodiment, a process to fabricate a polymer film includes baking a cyclic olefin copolymer (COC) and a silicon wafer at a predefined temperature. The process also includes attaching a plastic tape frame to the silicon wafer and submerging the COC and the plastic tape frame within water allowing one or more ultra-thin sheets of COC film to be peeled off.

In another embodiment, a process for creating one or more ultra-thin sheets of cyclic olefin copolymer (COC) film over large areas. The process includes dissolving a COC film in a solvent of sec-butylbenzene, and spinning of the COC film on a silicon wafer. The process also includes baking the COC film on a hotplate at or less than a predefined temperature, and applying a polymer tape frame to an outside edge of the silicon wafer. The process further includes submerging the silicon wafer in water and peeling away the polymer tape from the silicon wafer.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 1 is diagram illustrating a process for fabricating a polymer film, according to an embodiment of the present invention.

FIG. 2 is flow diagram illustrating a process for fabricating a polymer film, according to an embodiment of the present invention.

DETAILED DESCRIPTION OF THE EMBODIMENTS

One or more embodiments generally pertain to a process for fabricating a polymer film. In some embodiments, the polymer film is an ultra-large area polymer film for optical applications such as x-ray applications to far-IR applications. This process enables the fabrication of the ultra-large submicron scale thickness free standing polymer film. The polymer film may be used as windows and/or optical components for the x-ray and far-IR applications.

In some embodiments, a cyclic olefin copolymer (COC) is used. COC is a relatively new class of polymers similar to polyethylene and polystyrene both of which have high mechanical strength, exceptional chemical resistance, high optical transparency, and low moisture absorption and compatibility with standard semiconductor and microelectromechanical systems (MEMS) process chemistries.

Further, COC is a thermal plastics—this property can be utilized in molding the bulk material and/or patterning its surface. This mechanism can be used in tensioning a thin film membrane, if desired or needed, after hybridization on a supporting frame structure. In some cases, toluene and sec-butyl benzene have been used to dissolve solid COC pellets or to dilute Topas® solutions.

The gradual and reversible transition seen in amorphous materials such as thermal plastics—from a hard and relatively brittle "glassy" state into a viscous state—occurs at the glass transition (or glass-liquid transition) temperature. In cyclic olefin copolymer the norbornene fraction can be used to set the glass transition temperature and ultimately influences the material's heat resistance, thermal deflection temperature, thermal-plastic deformation, impact resistance as well as the infrared absorption band spectrum. For these reasons improved infrared/optical performance for the envisioned applications is correlated with increases in COC norbornene fraction.

COC, which is also referred to as Topas®, has been used as a substrate material for mid-infrared (IR) filters due to an absence of absorption lines in the IR. COC has also been used with devices, such as microfluidic devices, as an imprint photoresist for nanolithography. COC has also been used as a material for optical waveguides. Further, COC's may have higher strength than traditional materials.

By using COC, a thinner layer film may be used than otherwise used in the current x-ray and IR filters. Simply put, the use of COC with the embodiments described herein gives the potential to increase signal throughput.

FIG. 1 is diagram illustrating a process 100 for fabricating a polymer film 102, according to an embodiment of the present invention. In this embodiment, process 100 begins at S1 with applying COC 104 to a silicon wafer 102. In some embodiments, both, silicon wafer 102 and COC 104, are baked at a temperature less than 200 degrees Celsius. By baking silicon wafer 102 with COC 104 at a temperature less than 200 degrees Celsius, a thin film may be released under water, which will be discussed in more detail below. Further, the baking at a temperature less than 200 degrees Celsius eliminates the need for a release film such as a mold release. This way, contaminants from the release film are prevented to be imposed on the thin film.

At S2, a plastic tape frame 106 is attached on top of COC 104. In some embodiments, plastic tape frame 106 is attached at or near the outer edge of COC 104. Plastic tape frame 106 in some embodiments is a Kapton tape that is used to handle the thin film. At S3, COC 104 and plastic tape frame 106 are both submerged in water allowing one or more ultra-thin sheets of COC film to be peeled off.

Process 100 described above may have several benefits. For example, if a release substrate is patterned and etched with steps, the spinning of COC 104 on wafer 102 allows COC 104 to inherit the topography of the release substrate. It should be noted that this process is opposite to that of stamping.

FIG. 2 is flow diagram illustrating a process 200 for fabricating a polymer film, according to an embodiment of the present invention. For example, process 200 may create one or more ultra-thin sheets of COC film over large areas that can be used for optical windows, filters and optical components, to name a few.

In this embodiment, the process 200 begins at 202 with dissolving a COC film in a solvent of sec-butylbenzene. At 204, the COC film is spun on a silicon wafer. The thickness of the film is determined by the viscosity of the solution and dilution of the sec-butylbenzene and the rotation speed.

Next, at 206, the COC film is cured (or baked) on a hotplate at or less than a predefined temperature. In some embodiments, the curing process is critical in the releasing step. For example, the adhesion of the COC film is improved for higher temperature cures. If the COC film is cured above 200 degrees Celsius, then the adhesion is strong enough that standard semiconductor lithography processes can be used. If, however, the COC film is cured under 200 degrees Celsius, then the COC film will delaminate when submersed in water. This delamination is used in certain embodiments. In an embodiment, the COC film is cured for 5 min at 110 degrees Celsius on a hotplate. Because this temperature is low enough, the COC film can be released from the substrate (e.g., the silicon wafer). Further, the release of the COC film creates thermal stress that is not only minimal but high enough that the solvent is evaporated from the COC film.

Next, at 208, a polymer tape frame is applied to the outside edge of the silicon wafer. The inside diameter of the polymer tape frame determines the size of the membrane. In some embodiments, COC film is scratched on the outer part of the polymer tape frame to provide a space for water to release the film.

Next, at 210, the silicon wafer is submerged in water and the polymer tape is peeled away from the silicon wafer. The water lifts-off the film resulting in a thin membrane sheet, which is held by the tape frame.

Although not a requirement, in some embodiments, the sheet may be transferred to a metal ring or fixture as a final step in integration to the optical instrument. In applications where a flat sheet is required, the COC acts a heat shrinking film, which can be pulled taught by slowly heating in an oven or using a heat gun.

Some embodiments generally pertain to a process for creating one or more ultra-thin sheets of cyclic olefin copolymer (COC) film over large areas. The process includes dissolving a COC film in a solvent of sec-butylbenzene, and spinning of the COC film on a silicon wafer. The process also includes baking the COC film on a hotplate at or less than a predefined temperature, and applying a polymer tape frame to an outside edge of the silicon wafer. The process further includes submerging the silicon wafer in water and peeling away the polymer tape from the silicon wafer.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A process for fabricating a large-area ultra-thin polymer film with precisely controlled thickness for integration in an optical instrument, comprising:
    dissolving a cyclic olefin copolymer (COC) film in a solvent of sec-butylbenzene; spinning the COC film on a silicon wafer with the thickness of the COC film determined by the viscosity of the solvent and dilution of the sec-butylbenzene and rotation speed;
    baking the COC film and a silicon wafer at a predefined temperature;
    attaching a plastic tape frame to the silicon wafer;
    submerging the COC and the plastic tape frame within water allowing one or more ultra-thin sheets of COC film to be peeled off;
    releasing the COC film from the silicon wafer thereby creating a thermal stress allowing the solvent to evaporate from the COC film eliminating the need for a release film such as a mold release, preventing contaminants from the release film from being imposed on the COC film;
    and transferring the one or more ultra-thin sheets to a fixture for integration to the optical instrument.

2. The process of claim 1, further comprising:
    applying the COC to the silicon wafer prior to baking the silicon wafer and the COC at the predefined temperature.

3. The process of claim 1, wherein the applying of the COC to the silicon wafer comprises spinning the COC on the silicon wafer.

4. The process of claim 1, wherein the predefined temperature is less than 200 degrees Celsius.

5. The process of claim 4, wherein the plastic tape frame is applied at or near outer edge of the COC.

6. The process of claim 1, wherein the applying of the plastic tape frame to the silicon wafer comprises applying the plastic tape frame on top of the COC.

* * * * *